(12) United States Patent
Shchukin et al.

(10) Patent No.: US 7,421,001 B2
(45) Date of Patent: Sep. 2, 2008

(54) EXTERNAL CAVITY OPTOELECTRONIC DEVICE

(75) Inventors: Vitaly Shchukin, Berlin (DE); Nikolai Ledentsov, Berlin (DE)

(73) Assignee: PBC Lasers GmbH, Berlin (DE)

( * ) Notice: Subject to any disclaimer, the term of this patent is extended or adjusted under 35 U.S.C. 154(b) by 253 days.

(21) Appl. No.: 11/453,980

(22) Filed: Jun. 16, 2006

(65) Prior Publication Data
US 2008/0069173 A1      Mar. 20, 2008

(51) Int. Cl.
*H01S 3/03* (2006.01)
(52) U.S. Cl. ............................ 372/64; 372/6; 372/45.01
(58) Field of Classification Search .................... 372/64
See application file for complete search history.

(56) References Cited

U.S. PATENT DOCUMENTS 6,239,901 B1 * 5/2001 Kaneko ...................... 359/326

2006/0103380 A1 * 5/2006 Kochergin et al. ......... 324/244.1

\* cited by examiner

*Primary Examiner*—Dung T Nguyen
(74) *Attorney, Agent, or Firm*—Ked & Associates, LLP

(57) ABSTRACT

A device contains at least one leaky waveguide layer, and has a transparent substrate, having a higher refractive index. The leakage loss of the waveguide exceeds the modal gain needed to initiate waveguide lasing. The leaky emission is going into the substrate at a certain angle, is reflected from the substrate back surface, and returns towards the leaky waveguide layer exhibiting constructive or destructive interference. As the leakage emission is returned to the active medium, the low threshold current density lasing is possible. As the leakage angle is defined for a given wavelength, interference enables lasing only at certain wavelengths making it possible to realize wavelength-selectivity. The lobes of the output emission can be made arbitrarily narrow by increasing the thickness of the substrate and the exit angle of the lobes is controlled by the leakage angle of the waveguide.

13 Claims, 11 Drawing Sheets

US 7,421,001 B2

EXTERNAL CAVITY OPTOELECTRONIC DEVICE

BACKGROUND OF THE INVENTION

1. Field of the Invention

The invention pertains to the field of semiconductor devices. More particularly, the invention pertains to optoelectronic devices, such as laser diodes, light-emitting diodes and semiconductor optical amplifiers.

2. Description of Related Art

Light-emitting devices are broadly applied in modem optical storage, material processing, display and lighting systems. These devices usually utilize directional light extraction from the device either perpendicular to the surface or perpendicular to the edge facet, with power concentration is a certain angle. In a number of applications it is very desirable that the optical density per unit angle is as high as possible. Unfortunately, standard light emitting devices do not solve this problem. In light-emitting diodes the active media used in devices does not provide any angle selectivity. In edge-emitting lasers, to achieve sufficient modal gain for lasing, the active media is introduced into a narrow waveguide layer. Self-diffraction of the light at a narrow waveguide aperture at the laser facet may cause a significant broadening of the beam once it is exiting the crystal. Increasing thickness of the waveguide causes multimode operation with multiple emission lobes and, also, the threshold current density may be trongly increased. Another disadvantage of the conventional devices is the fact that their emission spectrum is broad, while most of the applications require wavelength-stabilized operation.

SUMMARY OF THE INVENTION

A device contains at least one leaky waveguide layer, and has a transparent substrate, having a higher refractive index. The leakage loss of the waveguide exceeds the modal gain needed to initiate waveguide lasing. The leaky emission is going into the substrate at a certain angle, is reflected from the substrate back surface, and returns towards the leaky waveguide layer exhibiting constructive or destructive interference. As the leakage emission is returned to the active medium, the low threshold current density lasing is possible. As the leakage angle is defined for a given wavelength, interference enables lasing only at certain wavelengths making it possible to realize wavelength-selectivity. The lobes of the output emission can be made arbitrarily narrow by increasing the thickness of the substrate and the exit angle of the lobes is controlled by the leakage angle of the waveguide.

BRIEF DESCRIPTION OF THE DRAWINGS

FIG. 2(a) shows a schematic representation of a far field pattern of the device on FIG. 1a.

FIG. 2(b) shows a schematic representation of a far field pattern of the device on FIG. 1b.

FIG. 2(c) shows a schematic representation of a far field pattern of the device on FIG. 1c.

DETAILED DESCRIPTION OF THE INVENTION

The present invention provides a way to improve performance of laser diodes, light-emitting diodes, optical amplifiers and photodetectors by providing high angular concentration of optical power and wavelength selectivity.

Figure 1:
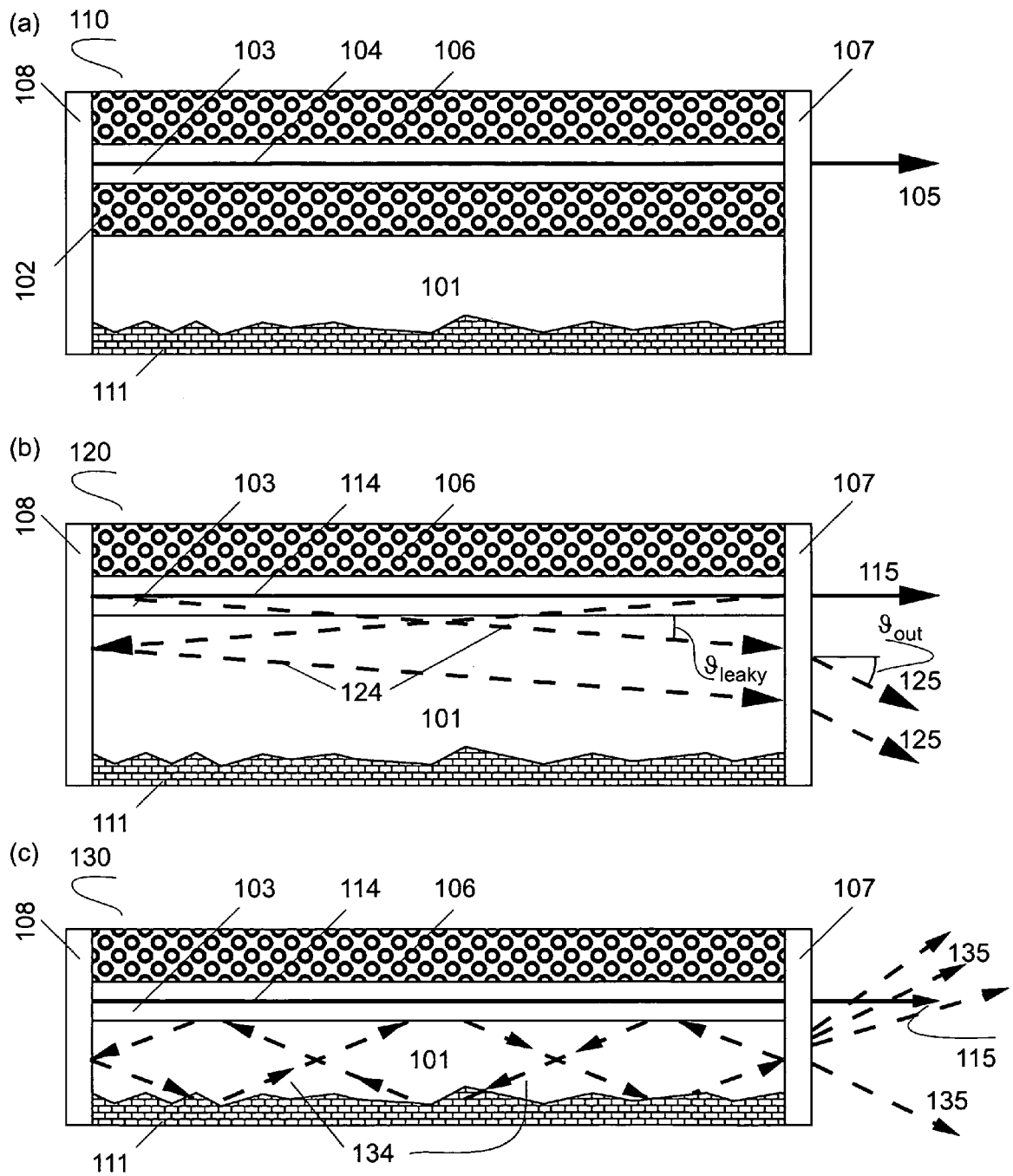
FIG. 1(a) shows a schematic diagram of a prior art edge-emitting device.
FIG. 1(b) shows a schematic diagram of a prior art edge-emitting laser with a leaky component exiting the crystal.
FIG. 1(c) shows a schematic diagram of a prior art device with a leaky component partially reflected by the bottom alloyed metal contact.

FIG. 1(a) shows a schematic diagram of a prior art edge-emitting device (110). The active region is placed in a waveguide region (103) clad by the bottom cladding layer (102) and the top cladding layer (106), each of which has a lower refractive index than the waveguide (103) and provides total internal reflection for the waveguiding optical mode (104). The device includes a substrate (101), the bottom cladding layer (102), a waveguide layer (103) with the active medium inserted, a top cladding layer (106), a contact layer and metal contacts on the top and on the bottom of the structure. The top contact layer and the top contacts are not shown in FIG. 1(a). The bottom contact (111) is shown, and it is emphasized that the contact made of a metal alloy has a rough structure resulting in partial scattering and absorption of light impinging on the contract from the substrate. Light is generated in a waveguide optical mode and is bounced between the front facet and the rear facet. Typically, a highly reflecting coating (108) is deposited on the rear facet, and a non-reflecting coating (107) is deposited on the front facet. Light comes out (105) through the front facet only.

FIG. 1(b) shows a schematic diagram of a prior art edge-emitting laser (120) where the cladding layer from the substrate side is either thin or absent and the light generated in the waveguide (114) may tunnel into the substrate. If the substrate has a higher refractive index, the light undergoes refraction under the angle defined by the ratio of refractive indices of the substrate and the leaky waveguide layer and propagates in the substrate as light directed at a certain angle (124). The emitted light exits the crystal. Light exiting the crystal from the waveguide (114) forms a beam (115) of the main emission. Light leaked into the substrate exits the crystal forming the beam (115) of the leaky emission. If the leakage loss is low, then the relative intensity of the leaky emission is low as compared to the main emission. If the leakage loss is high, then the overall optical losses are high and the threshold current density of the device is high.

FIG. 1(c) shows a schematic diagram of a prior art edge-emitting device with a leaky component partially reflected by the bottom alloyed metal contact (111) due to the large length of the cavity or a high leaky angle. In this case part of the light (134) is scattered and partially reflected back to the waveguide, however, the absorption loss in the contact region is high and the scattering loss in the contact region is high.

Figure 2:
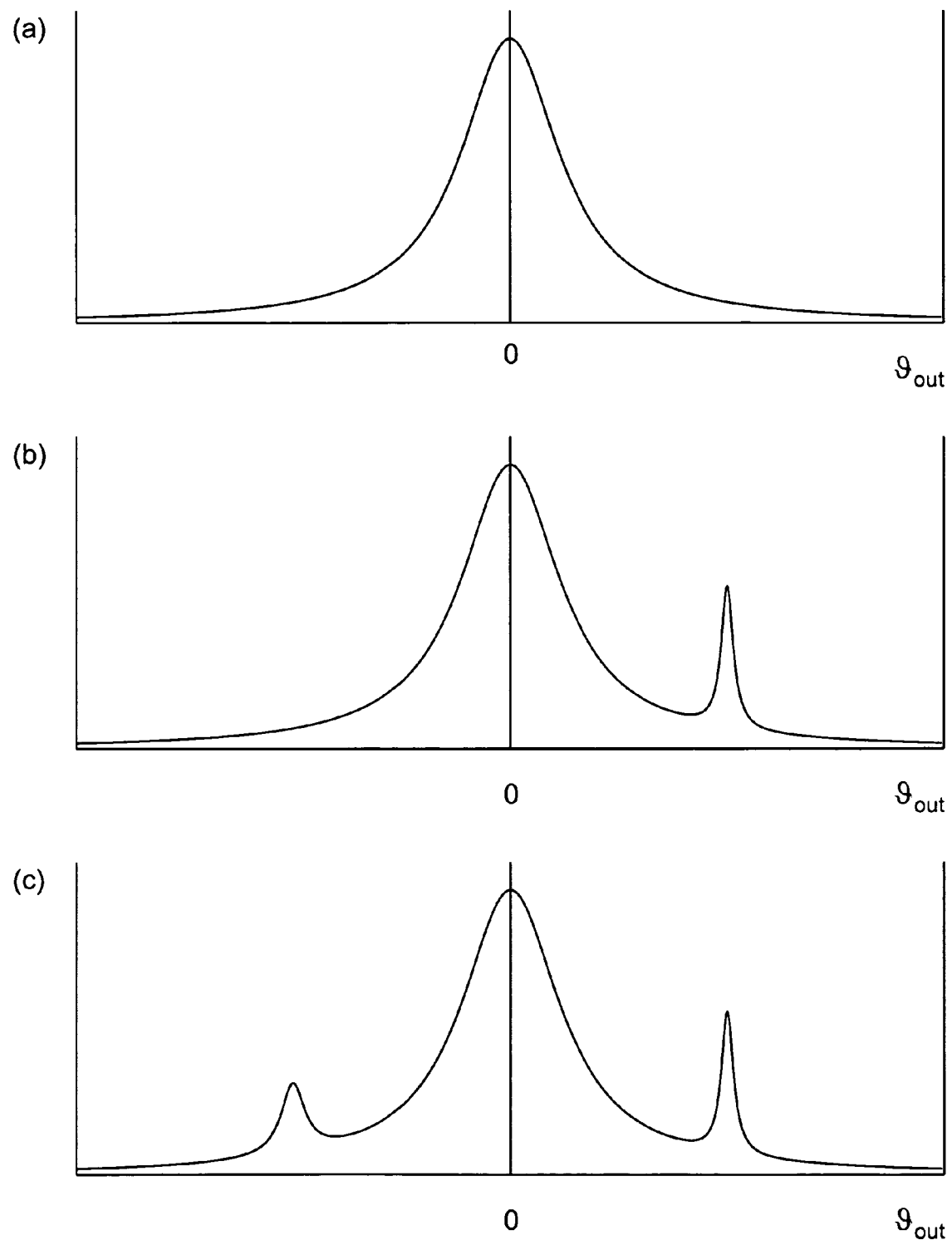

FIG. 2(a) shows a schematic representation of a far field pattern of the device of FIG. 1(a). As the laser light exits the output aperture the light diffracts resulting in a broad (typically 20-60 degrees full width at half maximum) beam. This beam is difficult to focus into a spot, as the effective focal length is short. Moreover, converting the diverging beam to a parallel one by a lens causes a significant decrease in the power density. Finally, external cavity applications which require high quality factor of the external cavity are difficult as the waveguide thickness is extremely narrow for efficient focusing of the reflected light back to the waveguide.

FIG. 2(b) shows a schematic representation of a far field pattern of the device of FIG. 1(b). In this case one can see that on top of the broad far field pattern of the in-plane waveguide emission, there appears a narrow lobe due to the leaky emission. If this emission is becoming dominating in the output power of the device, the threshold current density is dramatically increasing due to very high loss.

FIG. 2(c) shows a schematic representation of a far field pattern of the device of FIG. 1(c). Reflection and scattering of the leaky emission result in appearance of the broadened reflected peak in the far field spectrum.

Figure 3:
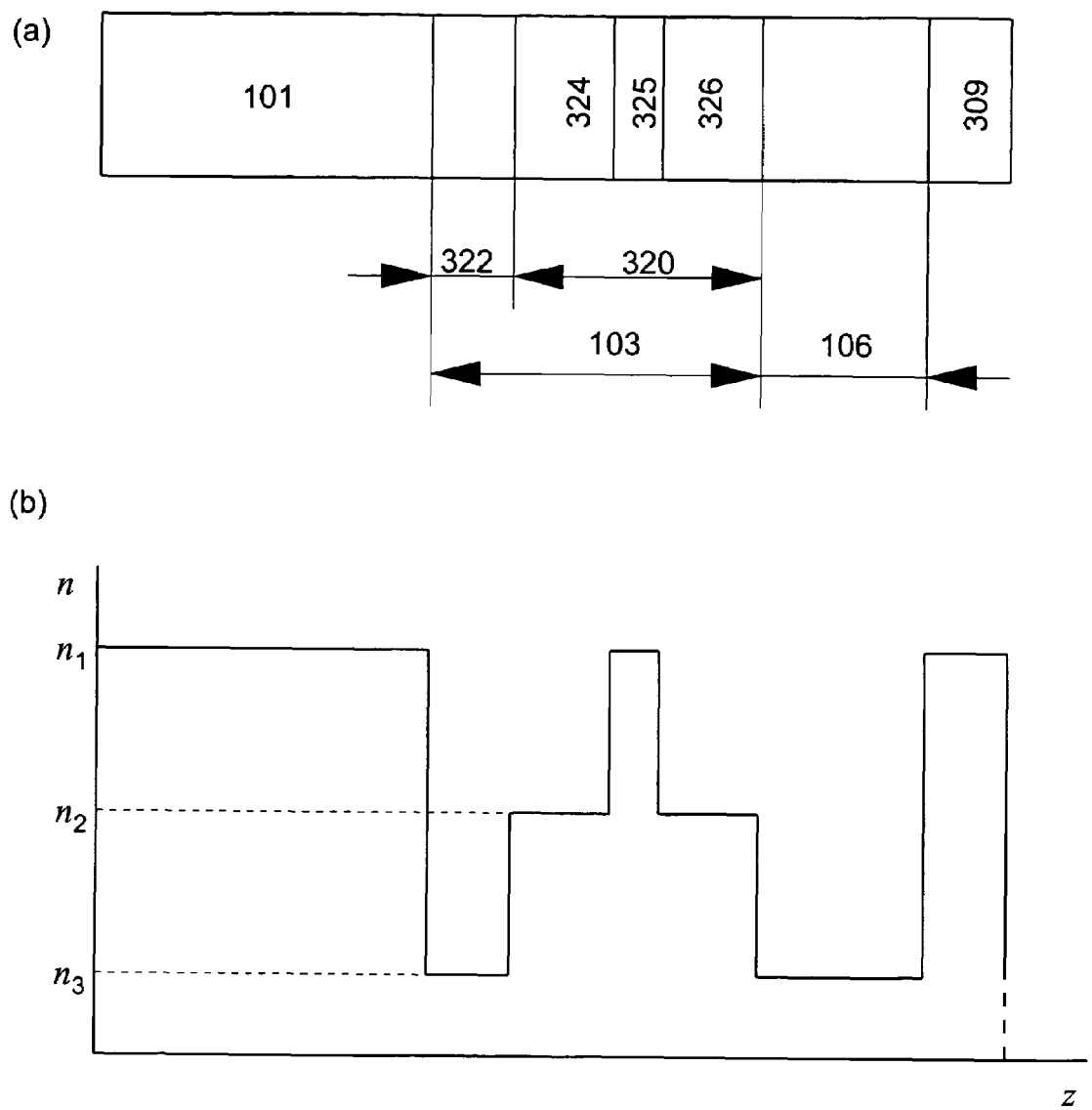
FIG. 3(a) illustrates a structure of a waveguide in a prior art leaky edge-emitting device.
FIG. 3(b) illustrates a refractive index profile in the structure of FIG. 3(a).

FIG. 3 illustrates means to control the leaky angle and leaky loss in a sample prior art leaky edge-emitting device. FIG. 3(a) illustrates the structure of the device (120) in more detail. The device comprises a substrate (101), a waveguide (103) which further comprises preferably narrow bottom cladding layer (322), a central part of the waveguide (320), which contains a layer (324), an active region (325), and a layer (326), a top cladding layer (106), and a top contact layer (309). FIG. 3(b) shows schematically the refractive index profile of the structure of FIG. 3(a).

A decrease of the thickness of the layer (322) leads to an increase in leaky loss as the tunneling of the optical mode becomes stronger. A decrease of the thickness of the waveguide (320) also results in an increase in leaky loss as the optical mode is squeezed out of the waveguide. A decrease of the refractive index $n_2$ of the layers (324) and (326) also results in an increase of the leaky loss and an increase of the leaky angle $\vartheta_{leaky}$. In a more complicated waveguide structure, the leaky angle is governed by the relationship between the refractive index of the substrate (101) and the effective refractive index of the optical mode.

Figure 4:
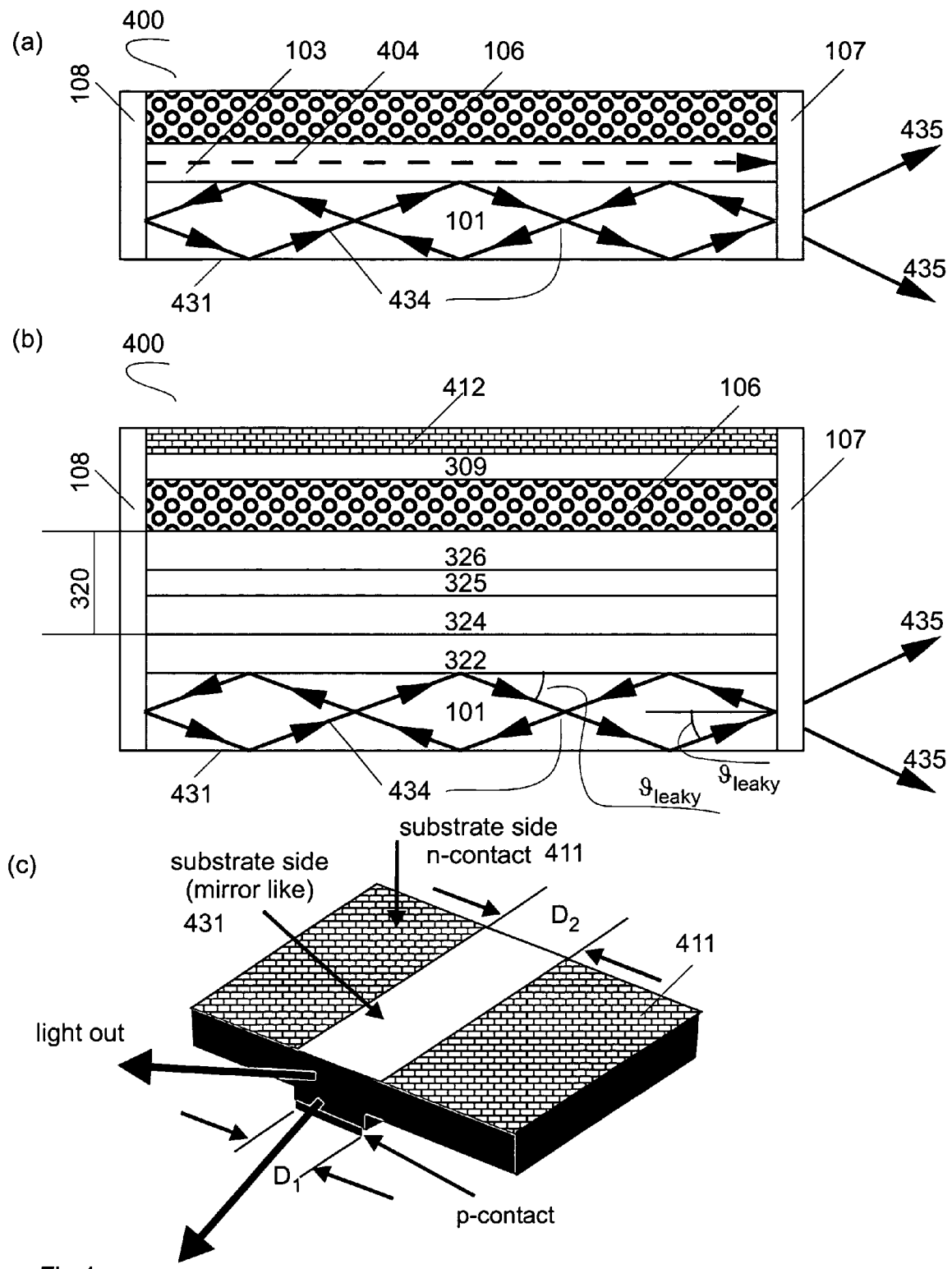
FIG. 4(a) shows a schematic diagram of a device of the present disclosure with a reflection from the substrate surface.
FIG. 4(b) shows a schematic diagram of the device of FIG. 4(a) in more detail.
FIG. 4(c) shows a schematic diagram of a device of the present disclosure with a reflection from the substrate surface with an example of one of possible processing layouts.

The main idea of the present disclosure is to propose an external cavity geometry, which enables low-threshold wavelength selective operation of the device. FIG. 4(a) shows a schematic diagram of a device (400) of a preferred embodiment of the present invention.

FIG. 4(b) shows a schematic diagram of a device (400) in more detail. The substrate (101) is formed from any III-V semiconductor material or III-V semiconductor alloy. For example, GaAs, InP, GaSb. GaAs or InP are generally used depending on the desired emitted wavelength of laser radiation. Alternatively, sapphire, SiC or [111]-Si is used as a substrate for GaN-based lasers, i.e. laser structures, the layers of which are formed of GaN, AlN, InN, or alloys of these materials. The substrate (101) is doped by an n-type, or donor impurity. Possible donor impurities include, but are not limited to S, Se, Te, and amphoteric impurities like Si, Ge, Sn, where the latter are introduced under such technological conditions that they are incorporated predominantly into the cation sublattice to serve as donor impurities.

The n-doped bottom cladding layer (322) is formed from a material lattice-matched or nearly lattice-matched to the substrate (101), is transparent to the generated light, and is doped by a donor impurity. In the case of a GaAs substrate (101), the n-doped cladding layer is preferably formed of a GaAlAs alloy.

The n-doped layer (324) of the waveguide (320) is formed from a material lattice-matched or nearly lattice-matched to the substrate (101), is transparent to the generated light, and is doped by a donor impurity. In the case of a GaAs substrate, the n-doped layer (324) of the waveguide is preferably formed of GaAlAs alloy having an Al content lower than that in the n-doped cladding layer (322).

The p-doped layer (326) of the waveguide (320) is formed from a material lattice-matched or nearly lattice-matched to the substrate (101), is transparent to the generated light, and is doped by an acceptor impurity. Preferably, the p-doped layer (326) of the waveguide is formed from the same material as the n-doped layer (324) but doped by an acceptor impurity. Possible acceptor impurities include, but are not limited to, Be, Mg, Zn, Cd, Pb, Mn and amphoteric impurities like Si, Ge, Sn, where the latter are introduced under such technological conditions that they are incorporated predominantly into the anion sublattice and serve as acceptor impurities.

The p-doped cladding layer (106) is formed from a material lattice-matched or nearly lattice-matched to the substrate (101), transparent to the generated light, and doped by an acceptor impurity.

The p-contact layer (309) is preferably formed from a material lattice-matched or nearly lattice matched to the substrate, is transparent to the generated light, and is doped by an acceptor impurity. The doping level is preferably higher than that in the p-cladding layer (106).

The metal contacts (411) and (411) are preferably formed from the multi-layered metal structures. The metal n-contact (411) is preferably formed from a structure including, but not limited to the structure Ni-Au-Ge. Metal p-contacts (412) are preferably formed from a structure including, but not limited to, the structure Ti-Pt-Au.

A window is formed on the back side of the substrate, where no bottom, or n-contact (411) is deposited, and the back substrate surface is mirror-like.

The confinement layer (325) is formed from a material lattice-matched or nearly lattice-matched to the substrate (101), is transparent to the generated light, and is either undoped or weakly doped. The active region is preferably placed within the confinement layer (325) is preferably formed by any insertion, the energy band gap of which is narrower than that of the substrate (101). Possible active regions include, but are not limited to, a single-layer or a multi-layer system of quantum wells, quantum wires, quantum dots, or any combination thereof. In the case of a device on a GaAs-substrate, examples of the active region include, but are not limited to, a system of insertions of InAs, $In_{1-x}Ga_xAs$, $In_xGa_{1-x-y}Al_yAs$, $In_xGa_{1-x}As_{1-y}N_y$, or similar materials.

Highly reflecting coating (108) is mounted on the rear facet of the device, and an anti-reflecting coating (107) is mounted on the front facet of the device.

The device operates as follows. The active region generates gain, when a forward bias is applied. Light (404) generated in the leaky waveguide (320) leaks to the substrate (101). Light in the substrate propagates (434) at a certain leaky angle $\vartheta_{leaky}$ to the plane of the substrate surface. Light is reflected back from the back surface (431) of the substrate. Thus, the external resonator is formed between the leaky waveguide (320) and the back surface of the substrate (431). Since the thickness of the substrate significantly exceeds the wavelength of light in the vacuum (preferred wavelengths of light range between 300 nm and 30 μm), the propagation of light in the substrate obeys the laws of geometrical optics. Therefore, in order to allow the exit of light from the substrate through the facet, it is necessary that the leaky angle $\vartheta_{leaky}$ is below the angle of the total internal reflection at the semiconductor-air interface. Then, light comes out (435) through the front facet forming preferably a two-lobe far-field pattern with narrow lobes.

If the back surface of the substrate is polished the light reflects back to the active region layer and no significant part of the light is lost. The threshold current density is low, even if the nominal leakage loss is high. Moreover, the light interferes and only certain wavelengths result in constructive interference resulting is wavelength selectivity. In different approaches, the back side of the substrate may be coated, etching may be applied to enable wavelength adjustment, gratings can be deposited to additionally improve wavelength stabilization or enabling grating outcoupling of the light through the substrate, and so on. One or a few coatings can be deposited on the back surface of the substrate to protect the mirror-like quality of the surface.

FIG. 4(c) shows a schematic diagram of a device of the present disclosure with a reflection from the substrate surface with an example of one of possible processing layouts.

Figure 5:
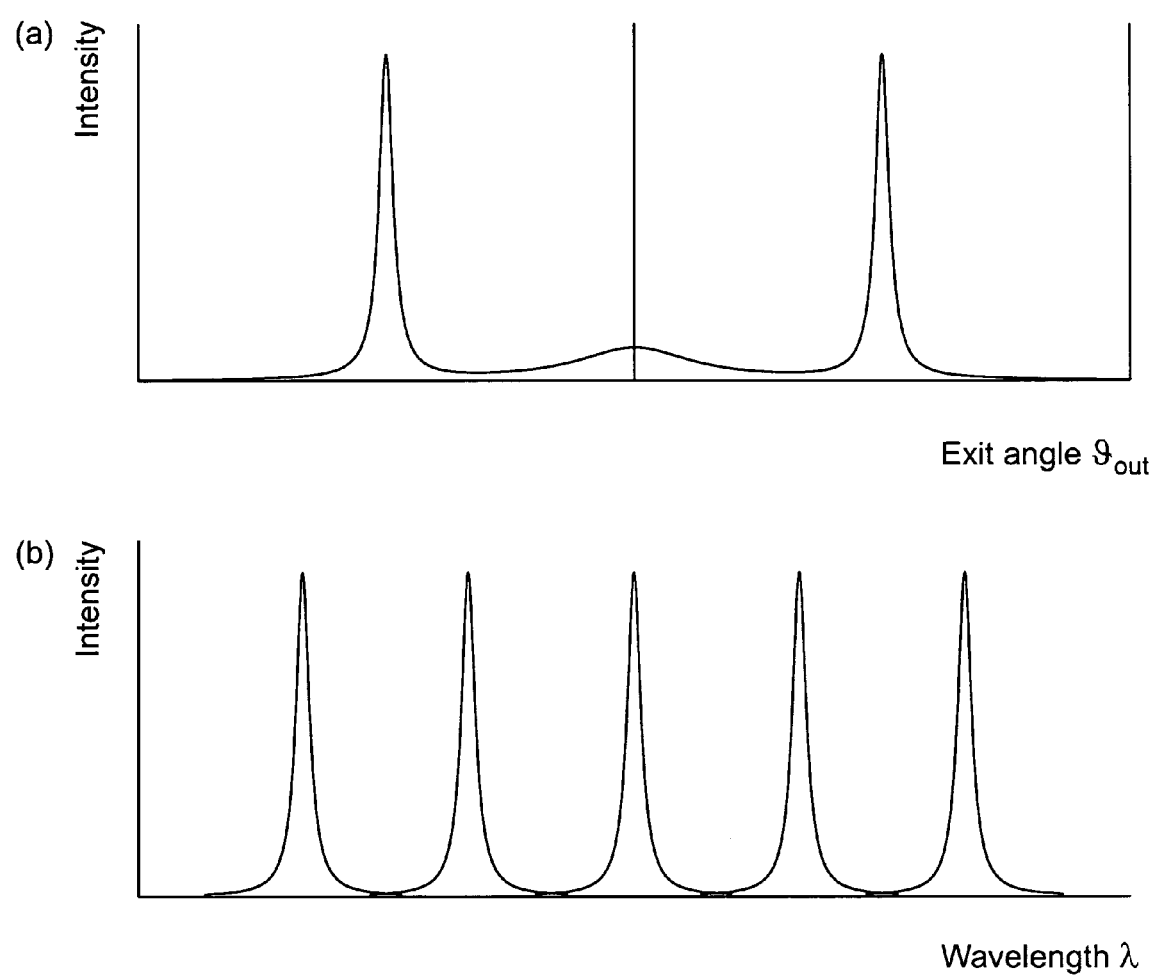
FIG. 5(a) shows a schematic representation of a far field pattern of a device of the present disclosure.
FIG. 5(b) shows a schematic representation of an emission spectrum of a device of the present disclosure.

FIG. 5(a) shows a schematic representation of a far field pattern of a device of the present disclosure. As the most of the light intensity is concentrated in the leaky emission, this emission also dominates the output signal.

FIG. 5(b) shows a schematic representation of an emission spectrum of a device of the present disclosure. Emission spectrum is a set of nearly equidistant peaks referring to the constructing interference of light leaking from the leaky waveguide to the substrate, reflecting back from the mirror-like back surface of the substrate and coming back to the active region. This allows achieving a wavelength-stabilized operation of the device.

Figure 6:
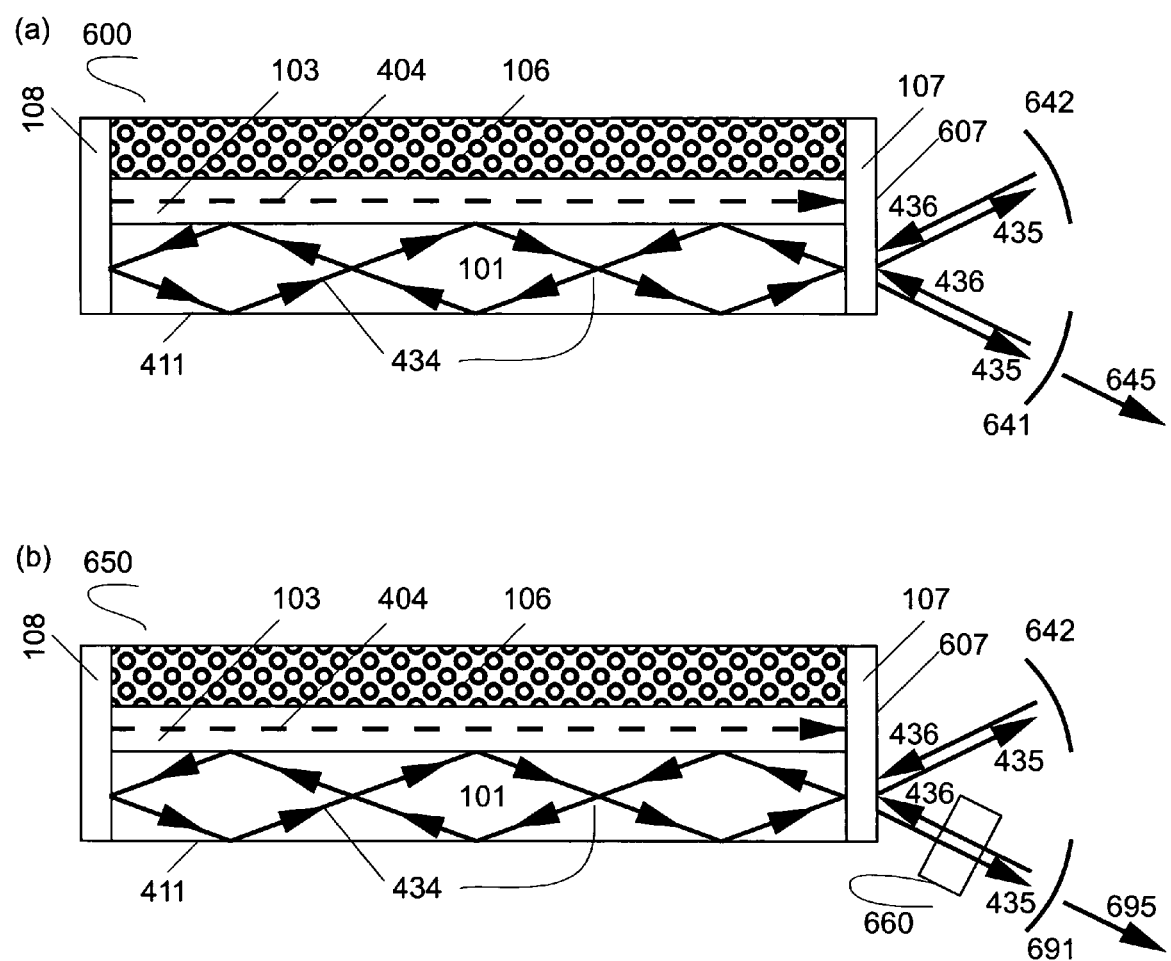
FIG. 6(a) shows a schematic representation of a device of the present disclosure in the external cavity geometry.
FIG. 6(b) shows a schematic representation of a device of the present disclosure in the external cavity geometry when a non-linear crystal is introduced in the cavity.

FIG. 6(a) shows a schematic diagram of a device (600) according to one another embodiment of the present invention. Light emitted via the facet (435) has preferably a two-lobe far field. Correspondingly, two collecting mirrors (641) and (642) are used to reflect light back (436) to the facet. One of the mirrors (641) may be chosen semi-transparent to allow laser light coming out (645). The device (600) comprises an edge-emitting device (400), a first cavity between the facet (607) and the mirror (641), a second cavity between the facet (607) and the mirror (642), a non-transparent collecting mirror (642), and a semi-transparent collecting mirror (641).

FIG. 6(b) shows a schematic diagram of a device (650) according to one another embodiment of the present invention. A non-linear crystal (660) is introduced into a cavity formed by the facet (607) and a mirror (691). The non-linear crystal (660) is set preferably set to generate the second harmonic of a primary light. External mirror (691) is preferably non transparent for the primary light and semi-transparent for the second harmonic of light. An advantage of using a wavelength-stabilized light for generating the second harmonics is related to a narrow spectral width in which typical non-linear crystals operate.

Figure 7:
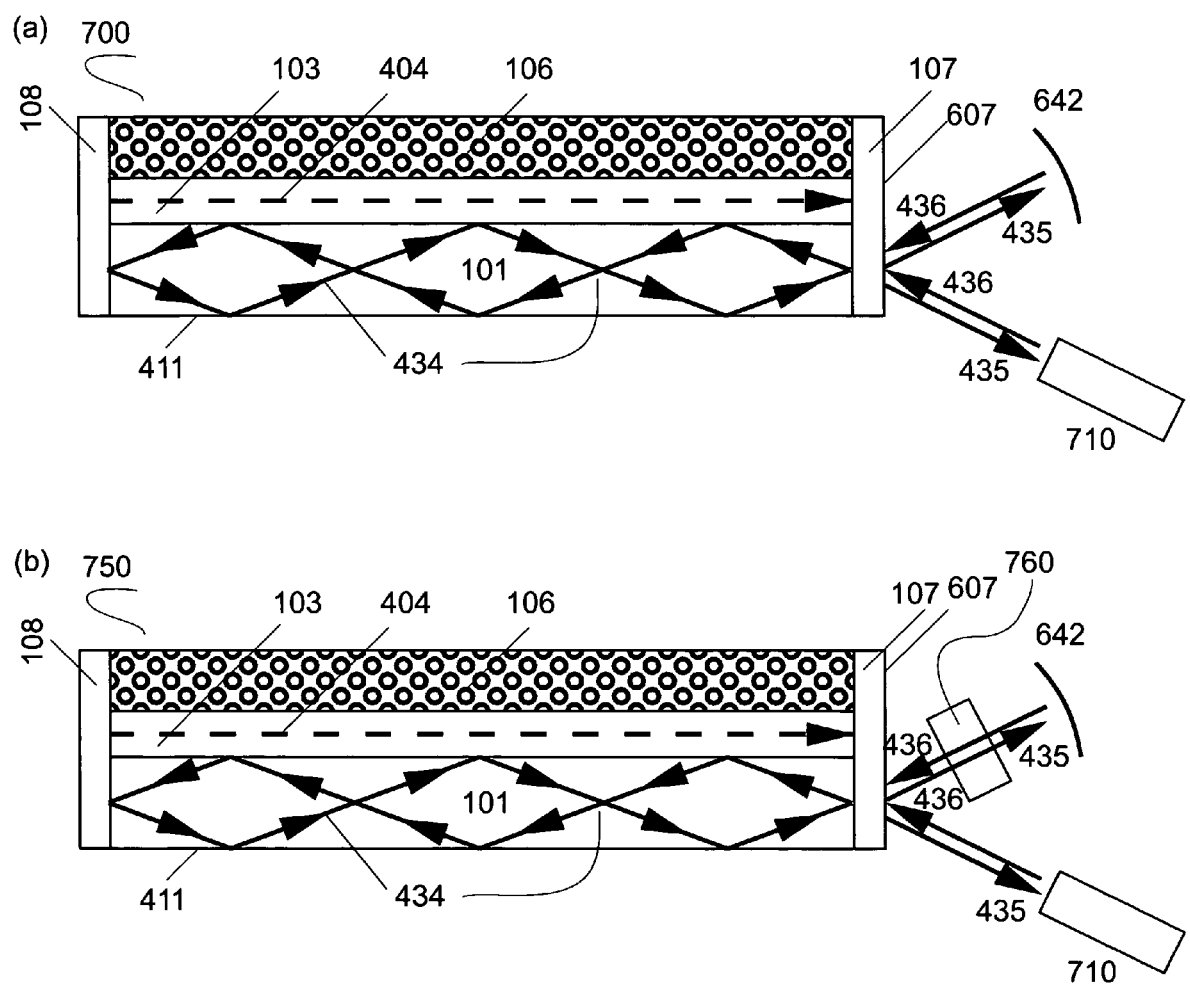
FIG. 7(a) shows a schematic representation of a device of the present disclosure in the external cavity geometry when the part of the emission is coupled to the optical fiber.
FIG. 7(b) shows a schematic representation of a device of the present disclosure in the external cavity geometry when the part of the emission is coupled to the optical fiber and the other part is reflected from a mirror with a wavelength-selective filter or grating.

FIG. 7(a) shows a schematic diagram of a device (700) according to yet another embodiment of the present invention, wherein part of the emitted light is coupled to an optical fiber (710).

FIG. 7(b) shows a schematic diagram of a device (750) according to a further embodiment of the present invention. One part of the emitted light is coupled to an optical fiber (710), and the other part is reflected from a mirror (642) with a wavelength-selective filter or grating (760). The filter (760) provides an additional wavelength selectivity.

Figure 8:
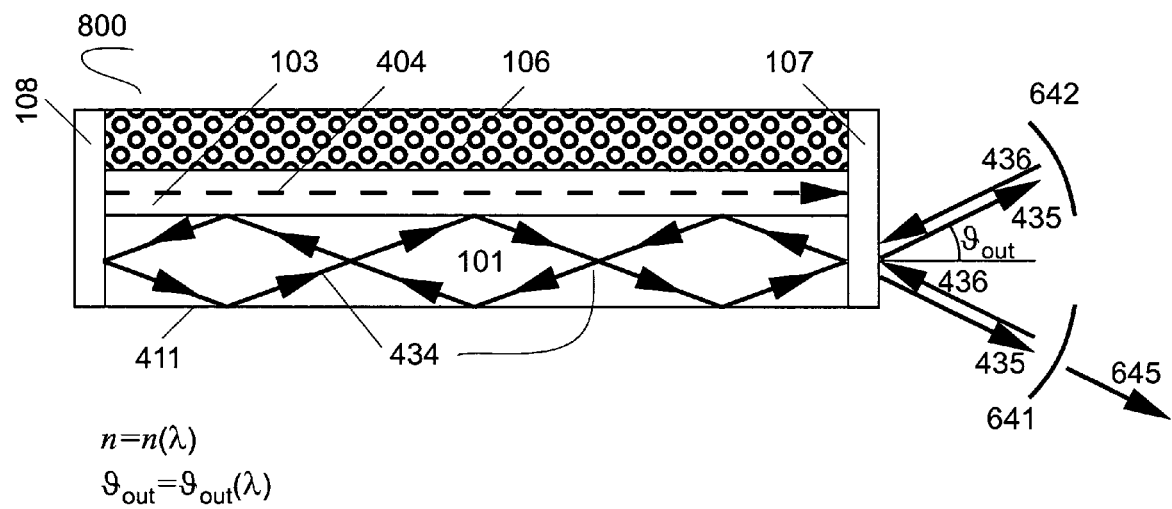
FIG. 8 shows a schematic representation of a device of the present disclosure in the external cavity geometry when the exit angle is a function of the emission wavelength. Adjusting of the angle enables selection of the particular emission wavelength out of the spectrum in FIG. 3.

FIG. 8 shows a schematic diagram of a device (800) according to one another embodiment of the present invention, wherein the exit angle $\vartheta_{out}$ is a function of the emission wavelength. Adjusting of the angle by a particular positioning of the mirrors enables selection of the particular emission wavelength out of the spectrum in FIG. 5(b).

Figure 9:
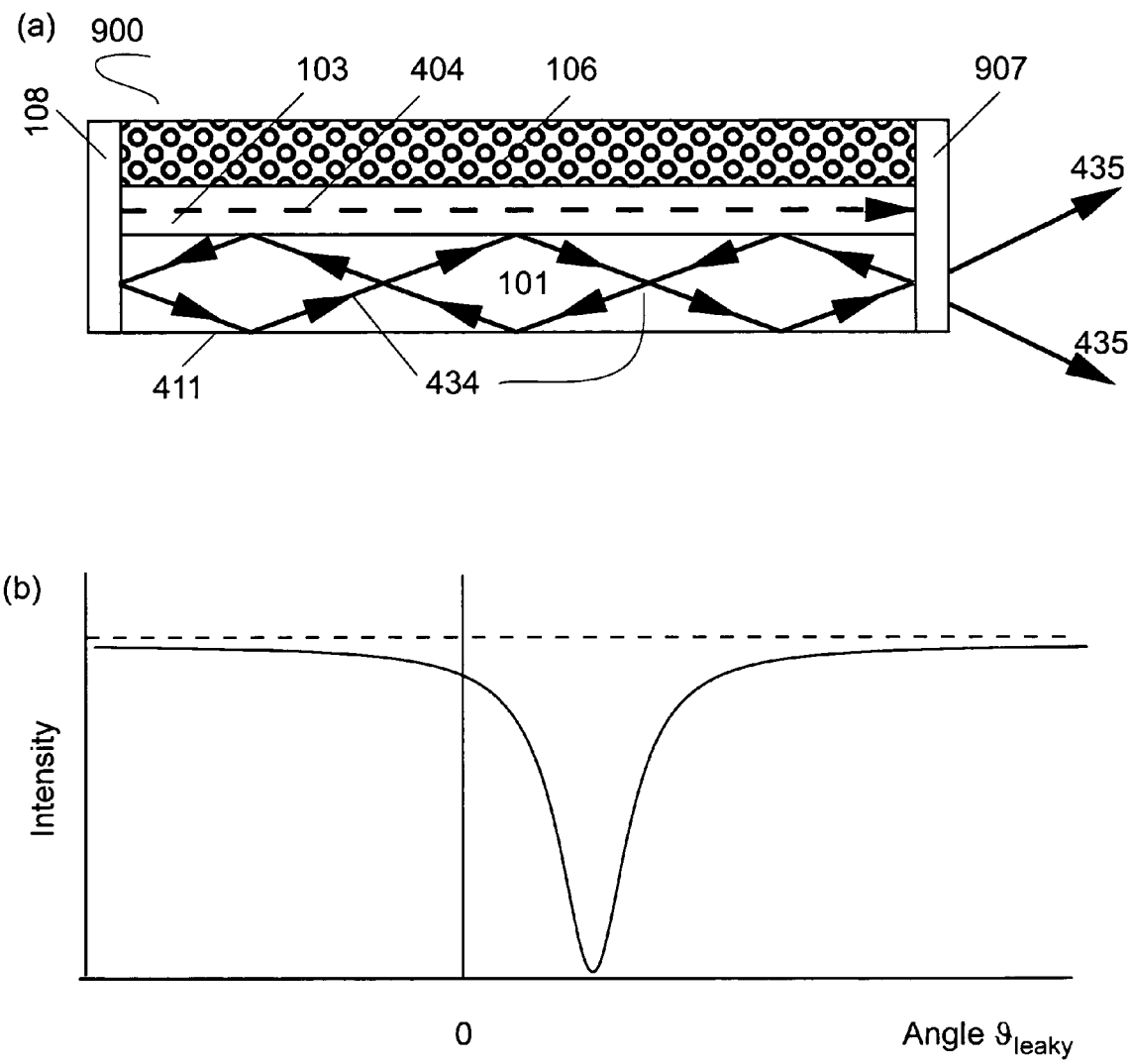
FIG. 9(a) shows a schematic representation of a device of the present disclosure when highly-reflective and special anti-reflecting coatings are deposited on the device.
FIG. 9(b) shows a schematic representation of the reflectivity spectrum of the anti-reflecting coating optimized to the leakage angle of the emission while the conventional planar waveguide emission is back-reflected.

FIG. 9(a) shows a schematic diagram of a device (900) according to yet another embodiment of the present invention where highly reflective coating (108) and a special anti-reflecting coating (907) are deposited on the device.

FIG. 9(b) shows a schematic representation of the reflectivity spectrum of the anti-reflecting coating (907) optimized to the leakage angle of the emission while the conventional planar waveguide emission is back-reflected. Such a coating favors the back reflection of the light from the planar waveguide and promotes exit of the leaky component of emission which impinges on the facet at tilt angle.

Figure 10:
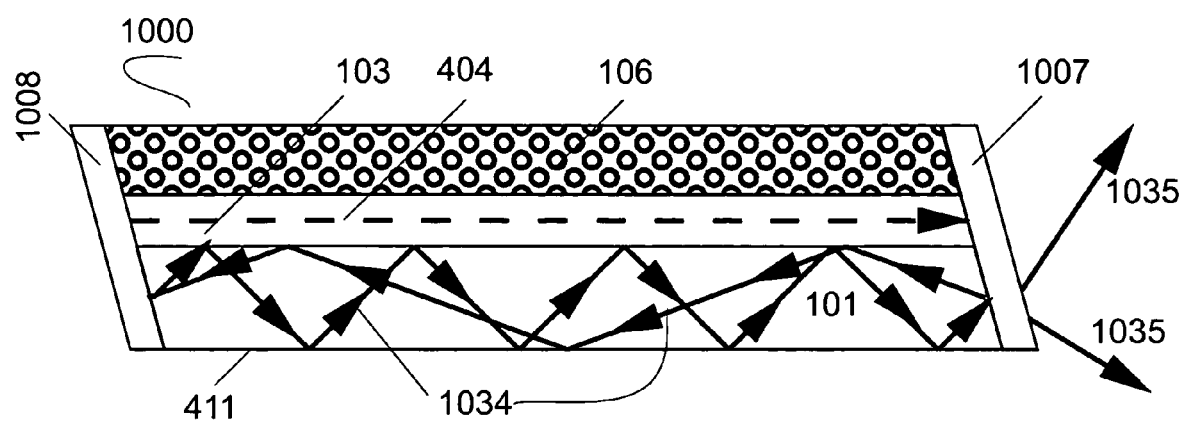
FIG. 10 shows a schematic representation of a device of the present disclosure when misoriented substrate is used for growth.

FIG. 10 shows a schematic diagram of a device according to one further embodiment of the present invention. A device (1000) is grown epitaxially on a vicinal substrate, misoriented to a certain angle with respect to conventional surface having low-index crystallographic orientation. The device facets are typically cleavage planes having low Miller indices, e.g. (110) or (1,-1,0). Thus the device facets (1007) and (1008) are not perpendicular to the p-n junction plane, but are tilted. A complex tilted waveguide is formed adding freedom in the engineering of a complex optical mode (1034) and angular intensity distribution of the emitted light (1035).

Figure 11:
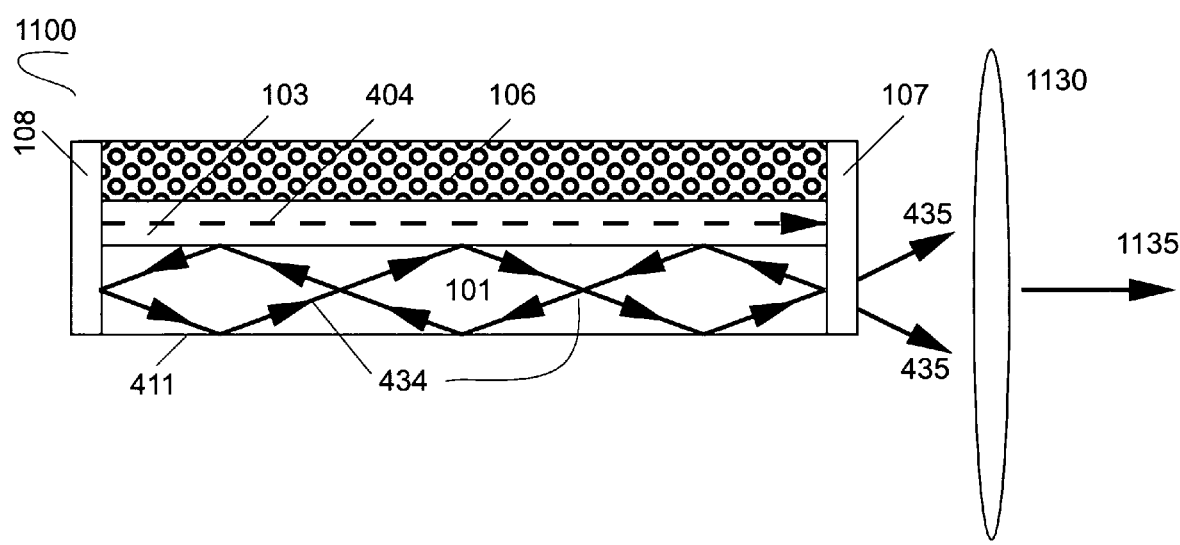
FIG. 11 shows a schematic representation of a device of the present disclosure when lense is used to convert two-lobe emission into a parallel beam or arbitrarily diverging beams.

FIG. 11 shows a schematic diagram of a device (1100) according to another embodiment of the present invention where a lens (1130) is used to the convert two-lobe emission (435) into a parallel beam (1135) or arbitrarily diverging beams.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention diverging beams.

The present invention should not be understood as limited to the specific embodiments set out above but to include all possible embodiments which are embodied within a scope encompassed and equivalents thereof with respect to the features set out in the appended claims. Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A semiconductor optoelectronic device comprising:
   a) a substrate;
   b) a leaky waveguide region placed on top of the substrate having a higher refractive index than the substrate;
   c) an active region within the leaky waveguide region capable to generate gain;
   d) an external resonator formed by the leaky waveguide region and back side of the substrate,
   wherein the leaky loss of the optical mode from the leaky waveguide region exceeds the gain needed to achieve laser action in the leaky waveguide region.

2. The semiconductor device of claim 1 wherein the gain is generated in the active region, if nonequilibrium carriers are injected into said active region.

3. The semiconductor device of claim 2, where the means of injection of nonequilibrium carriers are provided from plurality of
   a) photoexcitation of the active region, and
   b) current injection into the active region.

4. The semiconductor device of claim 1, wherein the device is selected of the group consisting of:
   a) light-emitting diode;
   b) laser diode; and
   c) semiconductor optical amplifier.

5. The semiconductor device of claim 4 exhibiting spectral features due to the interference of the emitted light from the back side of the substrate.

6. The semiconductor device of claim 5 where the spacing between the features exceeds ten nanometers.

7. The semiconductor device of claim 5 further comprising at least one external cavity, wherein the device is a semiconductor laser.

8. The semiconductor laser of claim 7 further comprising a nonlinear crystal placed in at least one external cavity.

9. The semiconductor device of claim 7, where the wavelength can be adjusted by changing an angle of the direction from the laser to at least one external mirror.

10. The semiconductor device of claim 9, operating as a wavelength-stabilized device.

11. The semiconductor device of claim 1 having reflective and anti-reflective facet coatings on the rear and front facets, respectively.

12. The semiconductor device of claim 10, where the anti-reflecting facet coating is optimized to have low reflectance at the angle of the leaky mode and high reflectance at the normal light incidence preventing loss due to the in-plane leaky waveguide emission.

13. The semiconductor device of claim 1, wherein the back side of the substrate is protected by at least one coating.

* * * * *